(12) United States Patent
Tetelbaum

(10) Patent No.: US 6,588,003 B1
(45) Date of Patent: Jul. 1, 2003

(54) METHOD OF CONTROL CELL PLACEMENT FOR DATAPATH MACROS IN INTEGRATED CIRCUIT DESIGNS

(75) Inventor: Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 21 days.

(21) Appl. No.: 09/892,241

(22) Filed: Jun. 26, 2001

(51) Int. Cl.[7] .................................................. G06F 9/45
(52) U.S. Cl. .................................. 716/10; 716/2; 716/9
(58) Field of Search ........................... 716/10, 8, 9, 17, 716/2

(56) References Cited

U.S. PATENT DOCUMENTS 5,838,583 A * 11/1998 Varadarajan et al. .......... 716/12
6,317,863 B1 * 11/2001 Segal ............................ 716/10

* cited by examiner

*Primary Examiner*—Don Wong
*Assistant Examiner*—Thuy Vinh Tran
(74) *Attorney, Agent, or Firm*—Fitch, Even, Tabin & Flannery

(57) ABSTRACT

A method of control cell placement that is optimum for an area constraint of a datapath structure is disclosed that includes the steps of receiving as input a description of a datapath structure including a group of constrained control cells and an area constraint; calculating the optimum placement of the control cells that lie outside the area constraint; calculating an optimum placement of the control cells that lie inside the area constraint; and generating as output the optimum placement of the control cells.

8 Claims, 7 Drawing Sheets

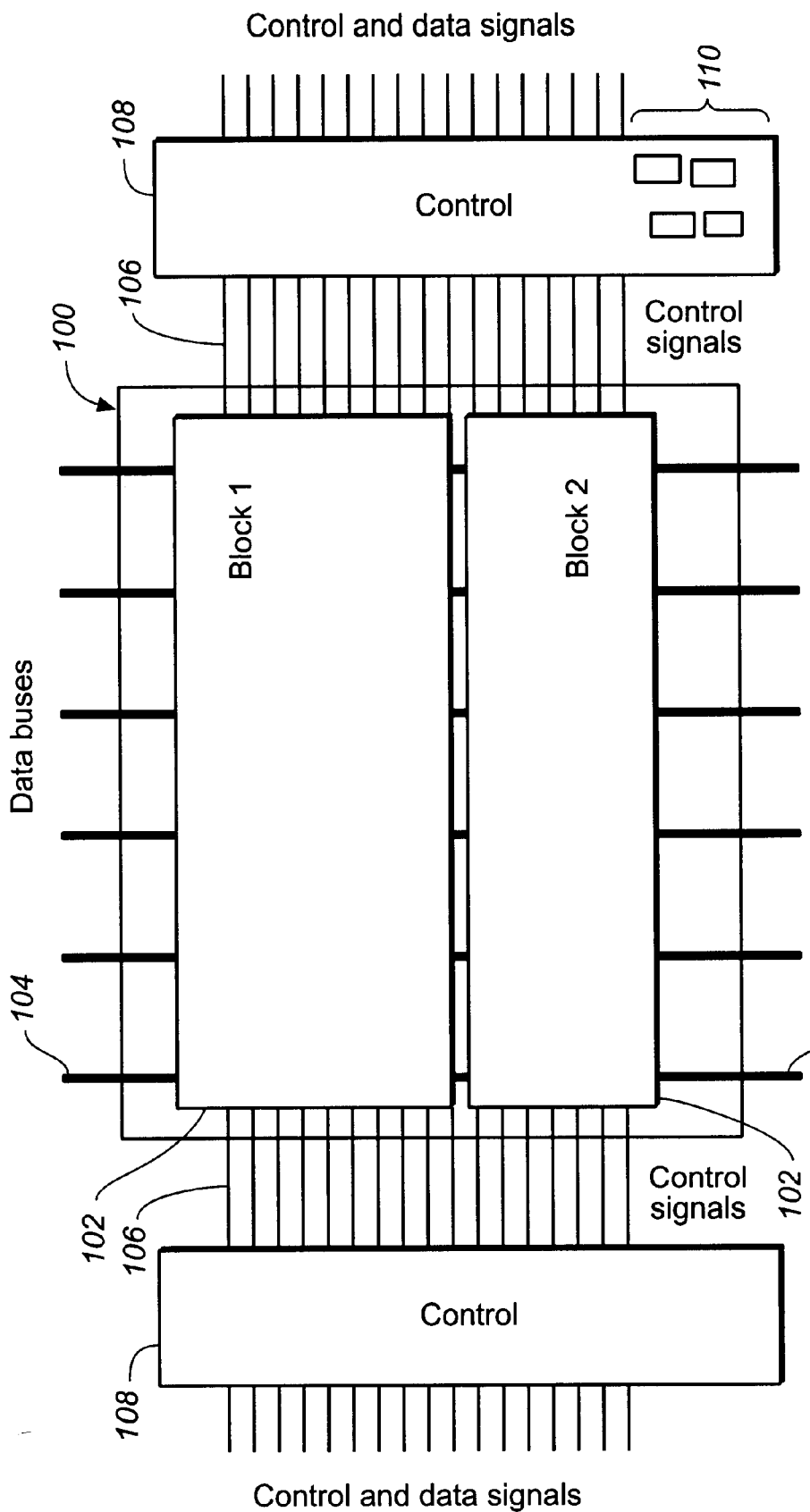
FIG._1 PRIOR ART

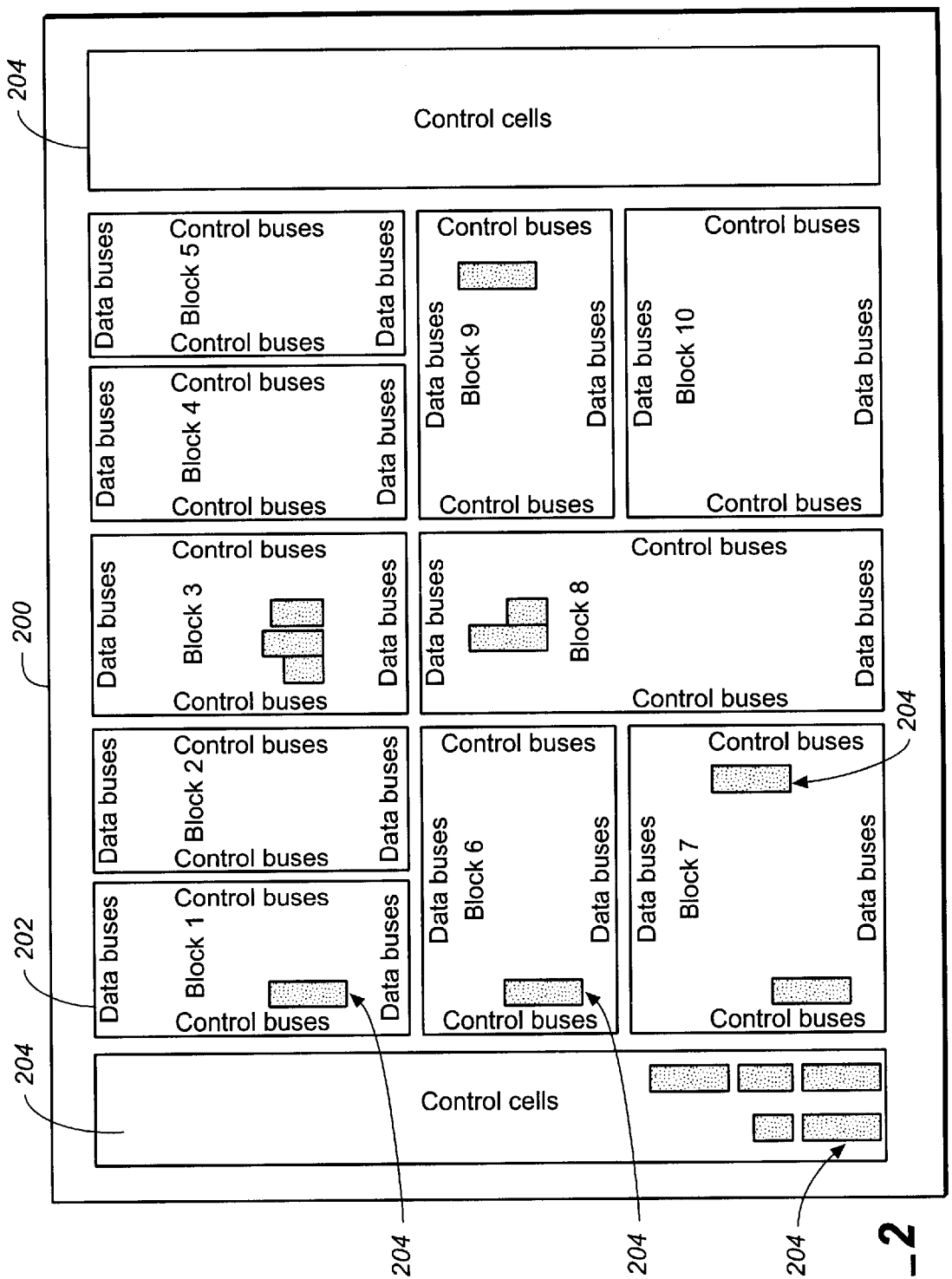
FIG._2

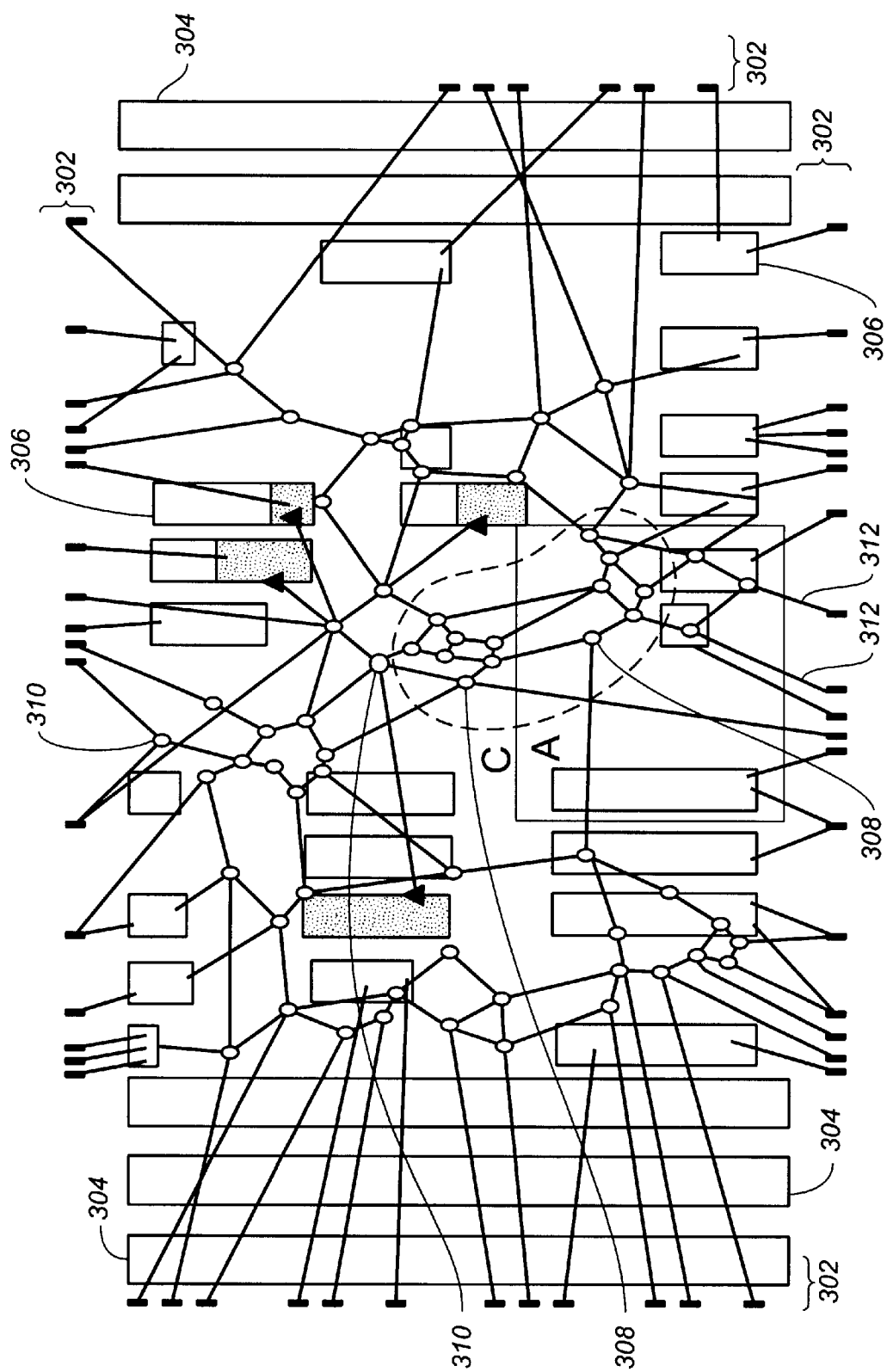
FIG._3

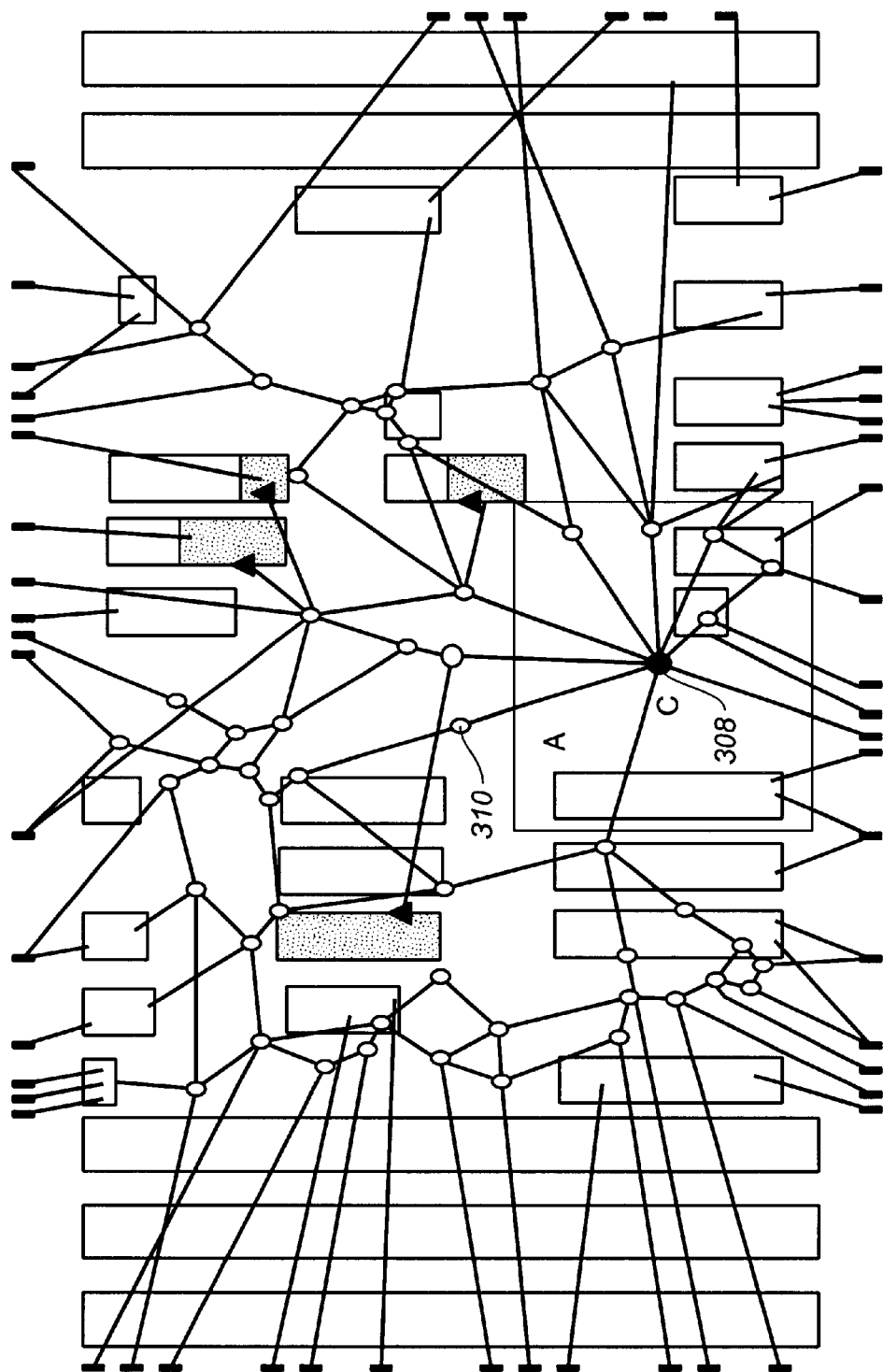
FIG._4

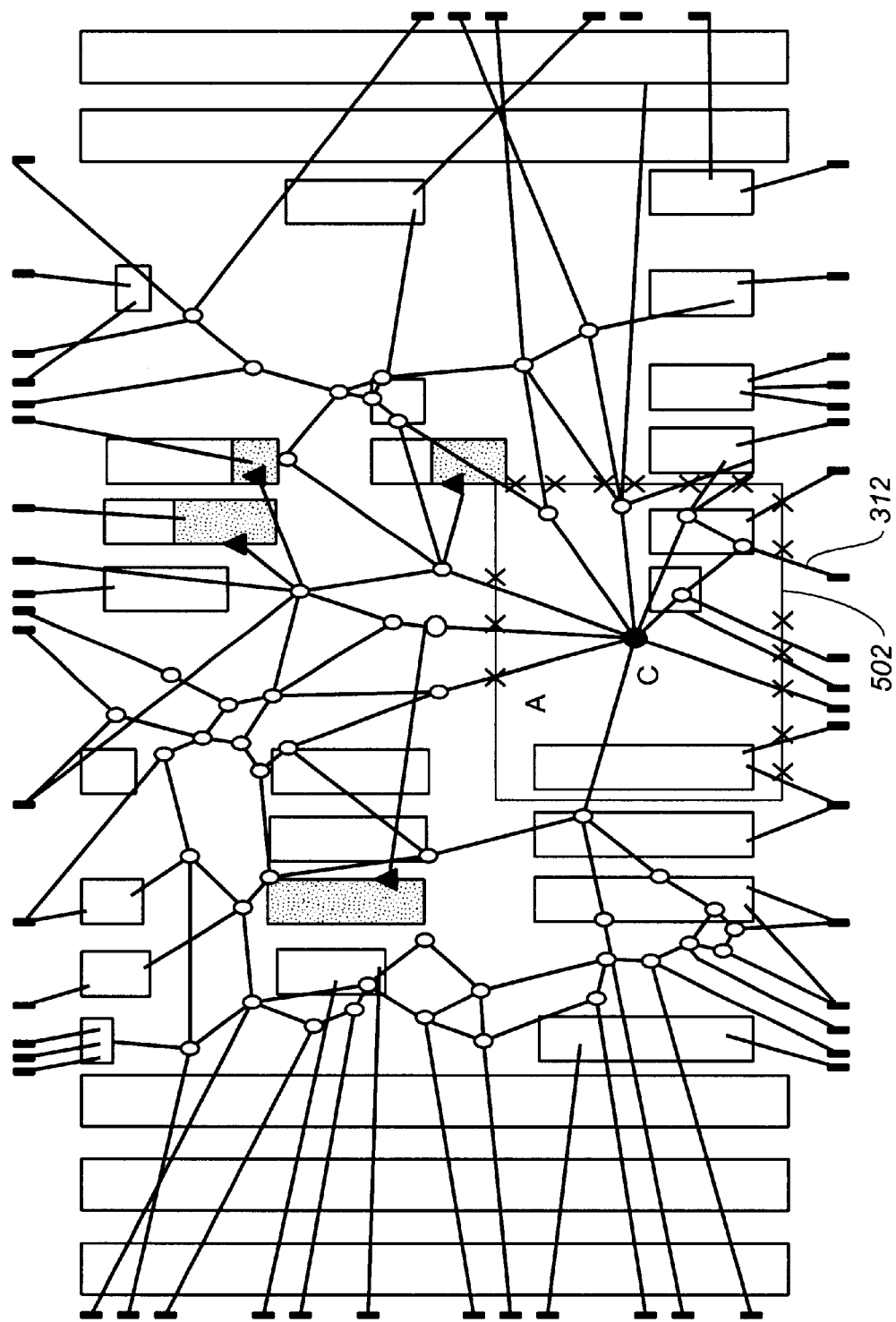
FIG._5

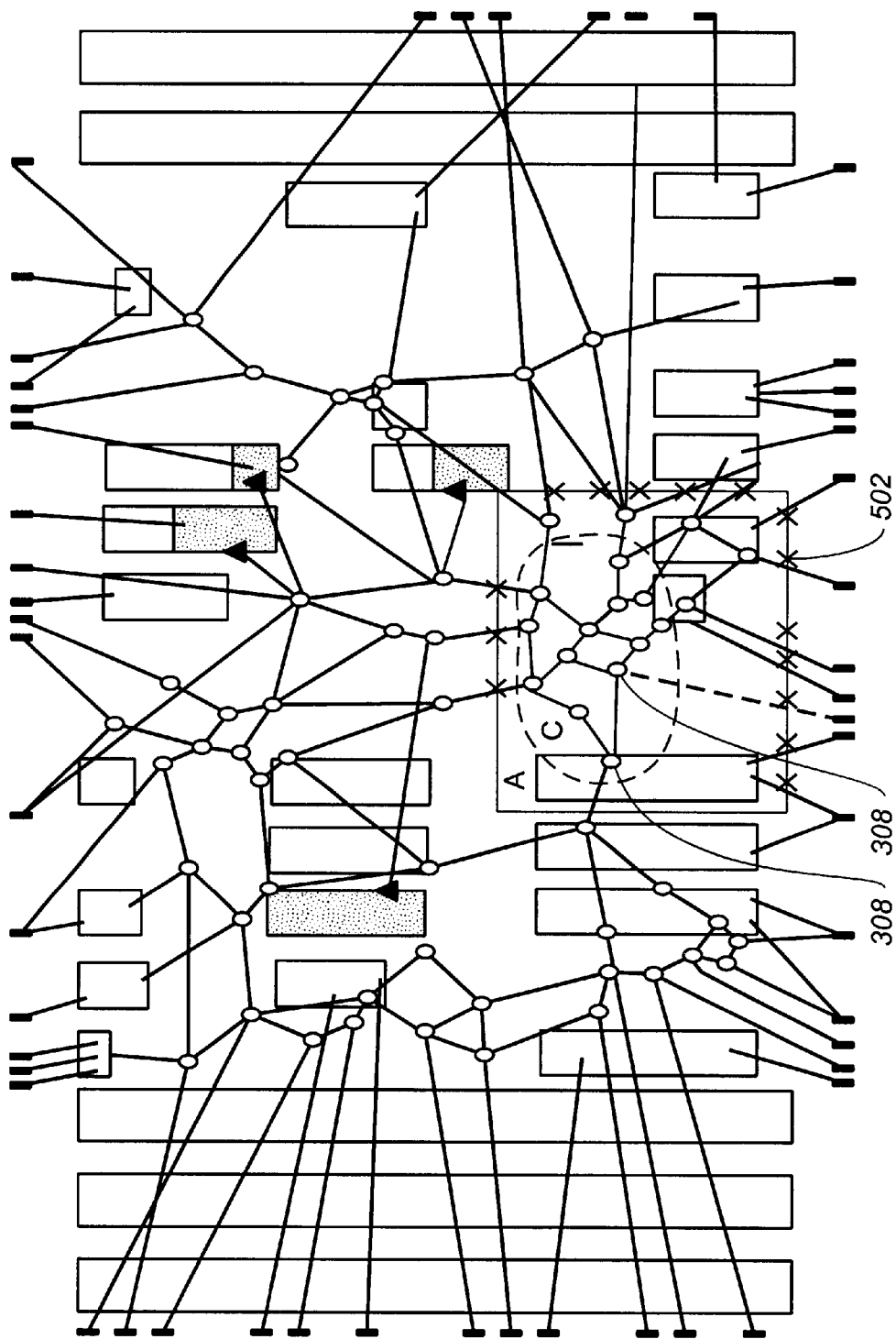
FIG._6

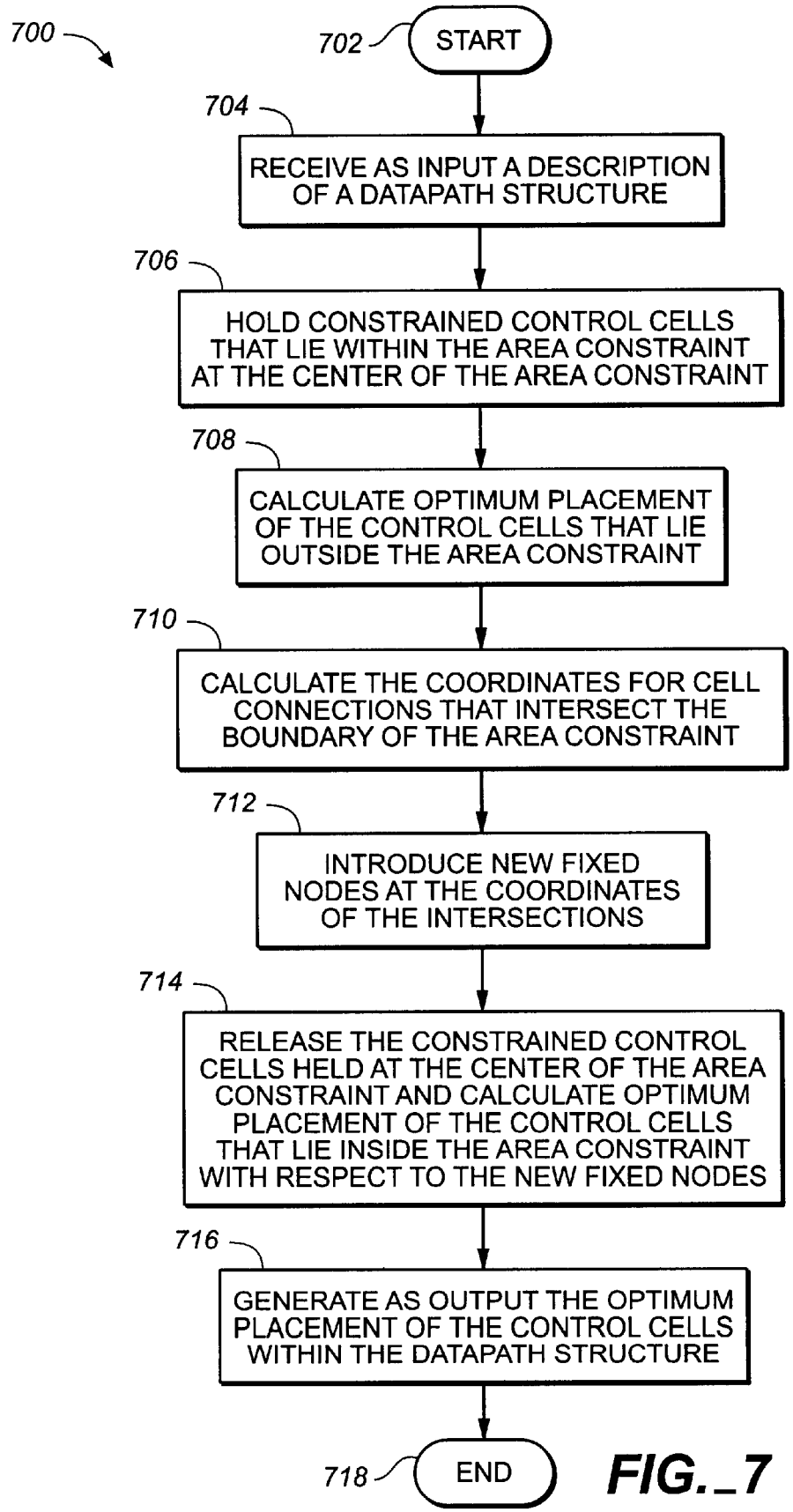
FIG._7

METHOD OF CONTROL CELL PLACEMENT FOR DATAPATH MACROS IN INTEGRATED CIRCUIT DESIGNS

BACKGROUND OF THE INVENTION

The present invention relates generally to design tools for integrated circuits. More specifically, but without limitation thereto, the present invention relates to a method of placing control cells and hardmac pins within a datapath macro to minimize signal propagation time and datapath macro area.

Integrated circuits typically include datapath macros. A datapath macro is an arrangement of datapath blocks connected by data buses and control signals. The data buses are generally routed vertically, and the control signals are generally routed horizontally. The datapath macro contains a set of datapath blocks placed along the vertical direction. Each datapath block has a datapath structure in which most data buses and control buses are located orthogonally with respect to each other and are connected to datapath cells in the datapath structure. Each of the datapath cells is connected to one or more of the data buses and to one or more of the control signals. As the size and complexity of the datapath macros and constituent datapath blocks increases, it becomes increasingly difficult for cell placement tools to arrange the datapath cells so that the signal propagation time through the datapath macro and the area of the datapath macro are minimized for datapath macro designs that include complex hierarchical structures, complex input constraints imposed on the placement of cells, pins, nets, gaps between cells, and so on. As the size and complexity of the datapath macros and constituent datapath blocks increases, therefore, signal propagation time through the datapath macro and the area of the datapath macro may be not be optimally minimized using conventional place and route methods.

SUMMARY OF THE INVENTION

The present invention advantageously addresses the problems above as well as other problems by providing a method of control cell placement in a datapath macro design that advantageously accommodates datapath structures having a large number of datapath and control cells, produces a globally ideal control cell placement in terms of connectivity length and interconnection delays, includes internal cell pins, and has an almost linear time cost function.

In one embodiment, the present invention may be characterized as a method of control cell placement that is optimum for an area constraint of a datapath structure that includes the steps of receiving as input a description of a datapath structure including a group of constrained control cells and an area constraint; calculating the optimum placement of the control cells that lie outside the area constraint; calculating an optimum placement of the control cells that lie inside the area constraint; and generating as output the optimum placement of the control cells.

In another embodiment, the invention may be characterized as a computer program product that includes a medium for embodying a computer program for input to a computer and a computer program embodied in the medium for causing the computer to perform the following functions: receiving as input a description of a datapath structure including a group of constrained control cells and an area constraint; calculating the optimum placement of the control cells that lie outside the area constraint; calculating an optimum placement of the control cells that lie inside the area constraint; and generating as output the optimum placement of the control cells.

BRIEF DESCRIPTION OF THE DRAWINGS

The present invention is illustrated by way of example and not limitation in the accompanying figures, in which like references indicate similar elements, and wherein:

FIG. 1 is a diagram of a typical datapath macro structure of the prior art;

FIG. 2 is a diagram of a general datapath structure for illustrating an embodiment of the present invention;

FIG. 3 is a diagram illustrating a method of ideal control cell placement for the datapath structure of FIG. 2 that is optimum for an area constraint according to an embodiment of the present invention;

FIG. 4 is a diagram illustrating the steps of holding in the center of the area constraint A the constrained control cells that lie in the area constraint A and finding the optimum coordinates for the unconstrained control cells;

FIG. 5 is a diagram illustrating the steps of finding the intersections of the control cell connections with the boundaries of the area constraint and introducing new fixed nodes at the intersections;

FIG. 6 is a diagram illustrating the steps of releasing the hold on the constrained control cells in the center of the area constraint and finding the optimum coordinates for the constrained control cells with respect to the new fixed nodes along the boundary of the area constraint; and FIG. 7 is a flowchart of a method of datapath cell placement according to an embodiment of the present invention.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE EMBODIMENTS

FIG. 1 is a diagram of a typical datapath macro structure 100. Shown in FIG. 1 are data blocks 102, data buses 104, control signals 106, control blocks 108, and control cells 110. In this example, the datapath macro contains only two data blocks 102. The control blocks 108 contain the control cells 110. The data buses 104 are generally routed vertically through the data path macro 100, while the control signals 106 are generally routed horizontally. The data blocks 102 are arranged to include some or all of the data buses 102 and the control signals 104, depending on the functional requirements of each of the data blocks 102. The control blocks 108 are placed on each side of the datapath macro 100. Previous methods for placement of the control cells 110 are satisfactory for the simple layout of FIG. 1, but are not practical for datapath structures with complex macro hierarchy, complex input constraints on placement of cells, pins, nets, and gaps between cells, blocks, and so on.

In previous methods for placement of the control cells 110, only simple constraints are allowed on the placement of pins, cells, and nets, resulting in poor quality of datapath macro design. In a complex macro hierarchy, a datapath macro may itself be a datapath block in a datapath macro of a higher level of the hierarchy, and the datapath macro of the higher level of the hierarchy may itself be a datapath block in a datapath macro of a higher level of the hierarchy, and so on.

FIG. 2 is a diagram of a general datapath structure 200 for illustrating an embodiment of the present invention. Shown in FIG. 2 are datapath blocks 202 and control cells 204.

Each of the datapath blocks 202 contains vertically routed data buses and horizontally routed control buses. In the general datapath structure 200, the control cells 204 may be placed not only along the left and right sides of the datapath macro 100 as in the example of the control cells 110 of FIG. 1, but may also be distributed inside the datapath blocks 202. For example, the placement of some control cells, such as drivers and receivers, may be constrained to gap cells in the left side area of a hardmac. It is also possible that some groups of cells may be constrained to an area that spans several datapath clusters. In a general case, several groups of cells may have corresponding area constraints.

The placement of control cells within the general datapath structure 200 cannot be solved by the placement of several groups of control cells 204 in different areas as with datapath cells. The problem of control cell placement is by nature a global placement problem, and the global placement algorithm should preferably be generalized to allow area constraints on the control cells to achieve macro designs of high quality.

FIG. 3 is a diagram illustrating a method of control cell placement for the datapath structure 200 of FIG. 2 that is optimum for an area constraint according to an embodiment of the present invention. Shown in FIG. 3 are placed hardmac pins 302, placement boxes 304, placed datapath cells 306, constrained control cells 308, unconstrained control cells 310, control cell connections 312, an area constraint A, and a group C including the constrained control cells 308.

The placed hardmac pins 302 are predetermined bu user constraints. The placement boxes 304 define the areas where control cells may be placed. The placed datapath cells 306 have locations already selected by a place and route tool. An optimum placement is sought for the constrained control cells 308 and the unconstrained control cells 310 that minimizes interconnection length and delay for the control cell connections 312. A method of the present invention for optimum placement of the constrained control cells 308 and the unconstrained control cells 310 in FIG. 3 is illustrated in FIGS. 4, 5, and 6.

FIG. 4 is a diagram illustrating the steps of holding in the center of the area constraint A the constrained control cells 308 and finding the optimum coordinates for the unconstrained control cells 310.

FIG. 5 is a diagram illustrating the steps of finding the intersections of the control cell connections 312 with the boundaries of area A and introducing new fixed nodes 502 at the intersections.

FIG. 6 is a diagram illustrating the steps of releasing the hold on the constrained control cells 308 in the center of area A and finding the optimum coordinates for the constrained control cells 308 with respect to the new fixed nodes 502 along the boundary of area A. The coordinates for all of the constrained control cells 308 in group C inside area A are optimized with respect to connection length because all fixed cells and nodes adjacent to the constrained control cells 308 in group C are located inside area A or on the boundary of area A.

The inclusion of the steps illustrated in FIGS. 4, 5, and 6 in a placement algorithm that does not recognize area constraints has little impact on the computation time: the steps of holding the constrained control cells 308 in the group C in the center of area A and finding the optimum coordinates for the unconstrained control cells 308 outside the group C decreases the computation time because the number of nodes representing control cells to be placed in area A is smaller due to the fact that all the control cells in group C are fixed at the same location in area A; the steps of finding the intersections of the control cell connections 312 with the boundaries of area A and introducing new fixed nodes at the intersections slightly increases the computation time because of the search for the intersection points; and the steps releasing the hold on the constrained control cells 308 in the center of area A and finding the optimum coordinates for the constrained control cells 308 with respect to the new fixed nodes 502 along the boundary of area A again decreases the computation time because the original placement problem has been decomposed into two smaller placement problems, the placement of constrained control cells inside area A and the placement of other control cells with respect to the additional fixed points, that is, the new fixed nodes 502. Taking into account the total effect of the steps illustrated in FIGS. 4, 5, and 6, the time complexity of the optimum placement algorithm is still proportional to n, where n is the total number of control cells to be placed.

FIG. 7 is a flowchart 700 of a method of datapath cell placement summarizing the steps described above according to an embodiment of the present invention.

Step 702 is the entry point of the flowchart 700.

In step 704, a description of a datapath structure including a group of constrained control cells and an area constraint is received as input.

In step 706, the constrained control cells are held at the center of the area constraint.

In step 708, the optimum placement of the control cells that lie outside the area constraint is calculated according to well known techniques.

In step 710, the coordinates of the intersections for control cell connections that intersect the boundary of the area constraint are calculated according to well known techniques.

In step 712, new fixed nodes are introduced at the coordinates of the intersections calculated in step 710.

In step 714, the constrained control cells held at the center of the area constraint are released and the optimum placement of the control cells that lie inside the area constraint is calculated with respect to the new fixed nodes.

In step 716, the optimum placement of the control cells within the datapath structure are generated as output.

Step 718 is the exit point for the flowchart 700.

Although the methods of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The method illustrated in the flowchart description above may be embodied in a computer program product and implemented by a computer according to well known programming techniques to perform the following functions: receiving as input a description of a datapath structure including a group of constrained control cells and an area constraint; calculating the optimum placement of control cells that lie outside the area constraint; calculating an optimum placement of the control cells that lie inside the area constraint; and generating as output the optimum placement of the control cells.

The method of the present invention for control cell placement described above advantageously accommodates datapath designs having a large number of datapath and control cells, produces a globally ideal control cell placement in terms of connectivity length and interconnection delays, includes internal cell pins, and has an almost linear time cost function.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of datapath cell placement comprising the steps of:
   (a) receiving as input a description of a datapath structure including a group of constrained control cells and an area constraint;
   (b) calculating an optimum placement of the control cells that lie outside the area constraint;
   (c) calculating an optimum placement of the control cells that lie inside the area constraint; and
   (d) generating as output the optimum placement of the control cells.

2. The method of claim 1 wherein the step (b) comprises a step of holding the constrained control cells at a center of the area constraint.

3. The method of claim 2 wherein the step (c) comprises the steps of:
   (c1) calculating coordinates of intersections of control cell connections with the boundary of the area constraint;
   (c2) introducing new fixed nodes at the coordinates of the intersections;
   (c3) releasing the constrained control cells held at the center of the area constraint; and
   (c4) calculating an optimum placement of the control cells inside the area constraint with respect to the new fixed nodes.

4. The method of claim 1 wherein the optimum placement of the control cells minimizes interconnection length and delay.

5. A computer program product comprising:
   a medium for embodying a computer program for input to a computer; and
   the computer program embodied in the medium for causing the computer to perform the following functions:
   (a) receiving as input a description of a datapath structure including a group of constrained control cells and an area constraint;
   (b) calculating an optimum placement of the control cells that lie outside the area constraint;
   (c) calculating an optimum placement of the control cells that lie inside the area constraint; and
   (d) generating as output the optimum placement of the control cells wherein the step (b) comprises a step of holding the constrained control cells at a center of the area constraint.

6. The computer program product of claim 5 wherein the step (c) comprises the steps of:
   (c1) calculating coordinates of intersections of control cell connections with the boundary of the area constraint;
   (c2) introducing new fixed nodes at the coordinates of the intersections;
   (c3) releasing the constrained control cells held at the center of the area constraint; and
   (c4) calculating an optimum placement of the control cells inside the area constraint with respect to the new fixed nodes.

7. A computer program product comprising:
   a medium for embodying a computer program for input to a computer; and
   the computer program embodied in the medium for causing the computer to perform the following functions:
   (a) receiving as input a description of a datapath structure including a group of constrained control cells and an area constraint;
   (b) calculating an optimum placement of the control cells that lie outside the area constraint;
   (c) calculating an optimum placement of the control cells that lie inside the area constraint; and
   (d) generating as output the optimum placement of the control cells wherein the step (b) comprises a step of holding the constrained control cells at a center of the area constraint and wherein the step (c) comprises the steps of:
   (c1) calculating coordinates of intersections of control cell connections with the boundary of the area constraint;
   (c2) introducing new fixed nodes at the coordinates of the intersections;
   (c3) releasing the constrained control cells held at the center of the area constraint; and
   (c4) calculating an optimum placement of the control cells inside the area constraint with respect to the new fixed nodes.

8. A computer program product comprising:
   a medium for embodying a computer program for input to a computer; and
   the computer program embodied in the medium for causing the computer to perform the following functions:
   (a) receiving as input a description of a datapath structure including a group of constrained control cells and an area constraint;
   (b) calculating an optimum placement of the control cells that lie outside the area constraint;
   (c) calculating an optimum placement of the control cells that lie inside the area constraint; and
   (d) generating as output the optimum placement of the control cells wherein the optimum placement of the control cells minimizes interconnection length and delay.

* * * * *